United States Patent
Fujimaki

(10) Patent No.: US 7,612,639 B2
(45) Date of Patent: Nov. 3, 2009

(54) RELAY MODULE AND ELECTRICAL COMPONENT UNIT

(75) Inventor: Hirohiko Fujimaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/583,163

(22) Filed: Oct. 19, 2006

(65) Prior Publication Data

US 2007/0093090 A1    Apr. 26, 2007

(30) Foreign Application Priority Data

Oct. 25, 2005   (JP)   ............................. 2005-309500

(51) Int. Cl.
*H01H 51/22*   (2006.01)
(52) U.S. Cl. .......................... 335/78; 335/106; 335/129
(58) Field of Classification Search ..................... 335/78
See application file for complete search history.

(56) References Cited

U.S. PATENT DOCUMENTS

| | | | | |
|---|---|---|---|---|
| 3,593,231 A | * | 7/1971 | Van Horn et al. | 335/152 |
| 3,789,332 A | * | 1/1974 | Jameel et al. | 335/152 |
| 3,809,965 A | * | 5/1974 | Groth et al. | 361/819 |
| 3,949,276 A | * | 4/1976 | Reuting | 361/643 |
| D249,883 S | * | 10/1978 | Collins | D13/159 |
| 4,158,836 A | * | 6/1979 | Wielebski et al. | 340/309.16 |
| 4,361,371 A | * | 11/1982 | Williams | 439/76.1 |
| 4,400,761 A | * | 8/1983 | Hayden et al. | 361/782 |
| 4,535,251 A | * | 8/1985 | Herman et al. | 250/551 |
| 4,899,257 A | * | 2/1990 | Yamamoto | 361/740 |
| 5,579,211 A | * | 11/1996 | Hendel | 361/819 |
| 5,761,039 A | * | 6/1998 | Bruees et al. | 361/704 |
| 6,005,768 A | * | 12/1999 | Jo | 361/685 |
| 6,025,610 A | * | 2/2000 | Kusaka et al. | 257/82 |
| 6,194,656 B1 | * | 2/2001 | Kondo et al. | 174/535 |
| 6,236,575 B1 | * | 5/2001 | Ritter | 361/819 |
| 6,261,105 B1 | * | 7/2001 | Uezono | 439/76.2 |
| 6,378,514 B1 | * | 4/2002 | Kaminaga et al. | 123/633 |
| 6,916,184 B2 | * | 7/2005 | Yamada | 439/76.2 |
| 7,002,808 B2 | * | 2/2006 | Lim et al. | 361/752 |
| 2005/0194552 A1 | * | 9/2005 | Yamaguchi | 250/551 |
| 2006/0027735 A1 | * | 2/2006 | Matsuyama | 250/214 R |
| 2006/0030217 A1 | * | 2/2006 | Maebashi et al. | 439/620 |
| 2007/0049070 A1 | * | 3/2007 | Fujimaki | 439/76.2 |

FOREIGN PATENT DOCUMENTS

JP   11026804 A  *  1/1999
JP   2002-293201    10/2002

* cited by examiner

*Primary Examiner*—Lincoln Donovan
*Assistant Examiner*—Mohamad A Musleh
(74) *Attorney, Agent, or Firm*—Kratz, Quintos & Hanson, LLP

(57) ABSTRACT

There is provided a relay module including: a power lead part connected to a power source; a connector lead part connected to a load; a relay switch interposed between the power lead part and the connector lead part, and electrically connected thereto; a control member for controlling the relay switch; and a molded part sealing at least ends of the power lead part and the connector lead part near the control member, the relay switch, and the control member.

2 Claims, 6 Drawing Sheets

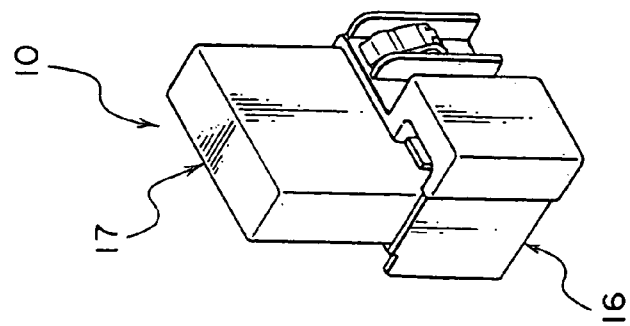
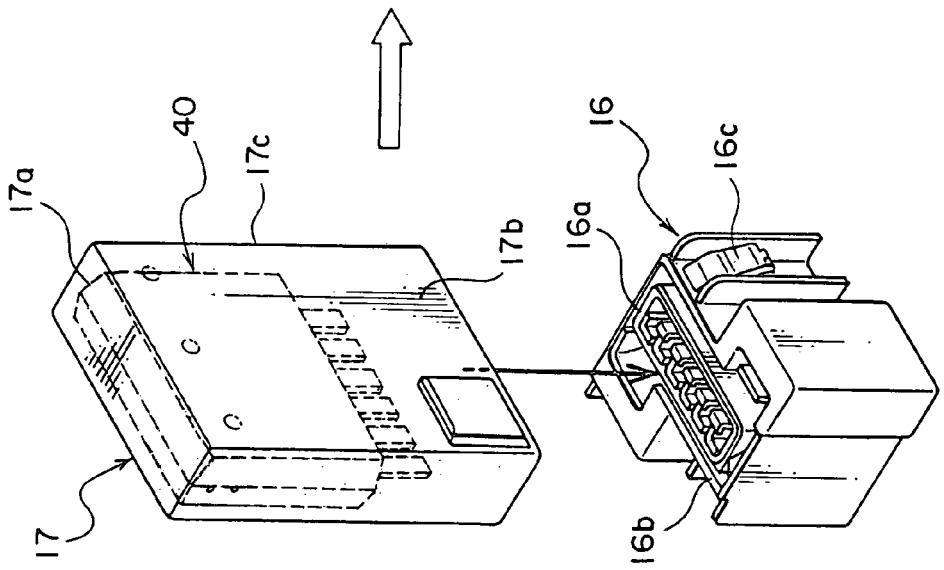
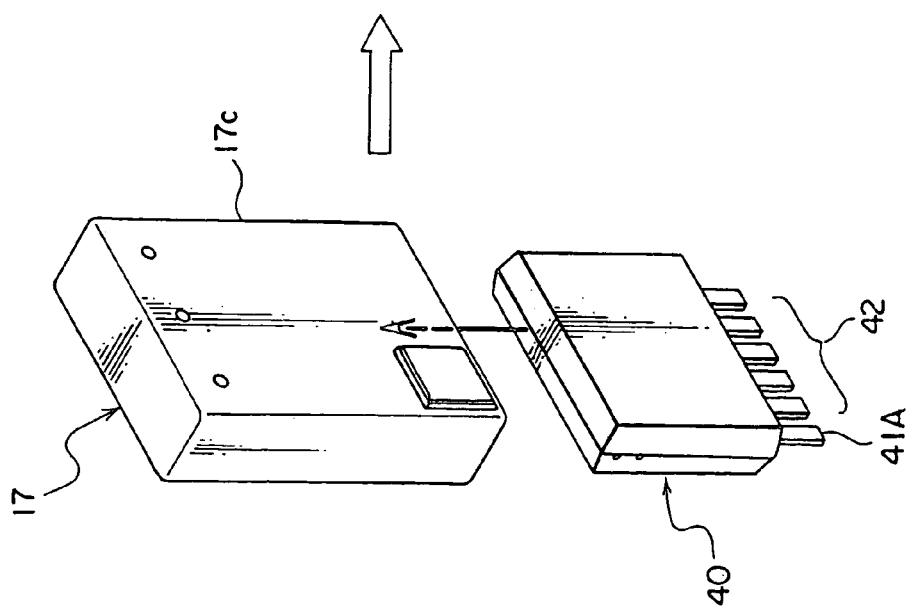

US 7,612,639 B2

RELAY MODULE AND ELECTRICAL COMPONENT UNIT

CROSS REFERENCE TO RELATED APPLICATIONS

This application is based on Japanese Patent Application No. 2005-309500, the contents of which are hereby incorporated by reference.

BACKGROUND OF THE INVENTION

1. Field of the Invention

The present invention relates to a relay module and an electrical component unit, in particular, to a relay module using a relay switch for supplying electric power to a load, and an electrical component unit.

2. Description of the Related Art

As an electrical component unit on a vehicle using a semiconductor relay such as an intelligent power switch (IPS), a unit having a control board on which a connector and a semiconductor relay are packaged is well known. The connector connects the load such as a headlamp, a fog lamp, and various motors to the control board. The semiconductor relay supplies the electric power to the load corresponding to an instruction from the control board.

Such an electrical component unit on a vehicle is disclosed in Japanese Patent Application No. 2002-293201. The electrical component unit on a vehicle receives the control board and a semiconductor relay module packaged on the control board in a case main body, and a cover covers the case main body. Regarding the semiconductor relay module, the semiconductor relay is bonded to a die pad, and molded integrally with a lead wire connected to the control board, a lead wire for the connector, and a lead wire for a battery. The semiconductor relay module and electronic parts for controlling the semiconductor relay module are packaged on the control board.

However, according to the electrical component unit on a vehicle described above, the control board is separated into a power part where the semiconductor relay module is packaged and a control part where the electronic parts are packaged. Therefore, a packaging area and a packaging volume on the control board are increased. A useless space is generated at the control part. Thus, the electrical component unit tends to be upsized. In such a configuration, because the number of parts is large, an assembling structure is complex, and a packaging process wastes time.

Accordingly, an object of the present invention is to provide a relay module and an electrical component unit that is able to be downsized, and save weight.

SUMMARY OF THE INVENTION

In order to attain the object, according to the present invention, there is provided a relay module including:
 a power lead part connected to a power source;
 a connector lead part connected to a load;
 a relay switch interposed between the power lead part and the connector lead part, and electrically connected thereto;
 a control member for controlling the relay switch; and
 a molded part sealing at least ends of the power lead part and the connector lead part near the control member, the relay switch, and the control member.

According to another aspect of the present invention, there is provided an electrical component unit including:
 a relay module described above;
 a connector connected to a wire from a load; and
 a receiving chamber for receiving the relay module and the connector, said relay module and the connector are electrically connected.

These and other objects, features, and advantages of the present invention will become more apparent upon reading of the following detailed description along with the accompanied drawings.

BRIEF DESCRIPTION OF THE DRAWINGS

FIG. 6A is an explanatory view showing how the relay module is assembled with a case main body;

FIG. 6B is an explanatory view showing how the relay module is assembled with a block member; and FIG. 6C is an explanatory view showing a finish of the assembling.

DETAILED DESCRIPTION OF THE PREFERRED EMBODIMENTS

First Embodiment

A first embodiment of an electric coupling box 1 including a relay module and an electrical component unit according to the present invention will be described with reference to FIGS. 1 to 4.

Figure 1:
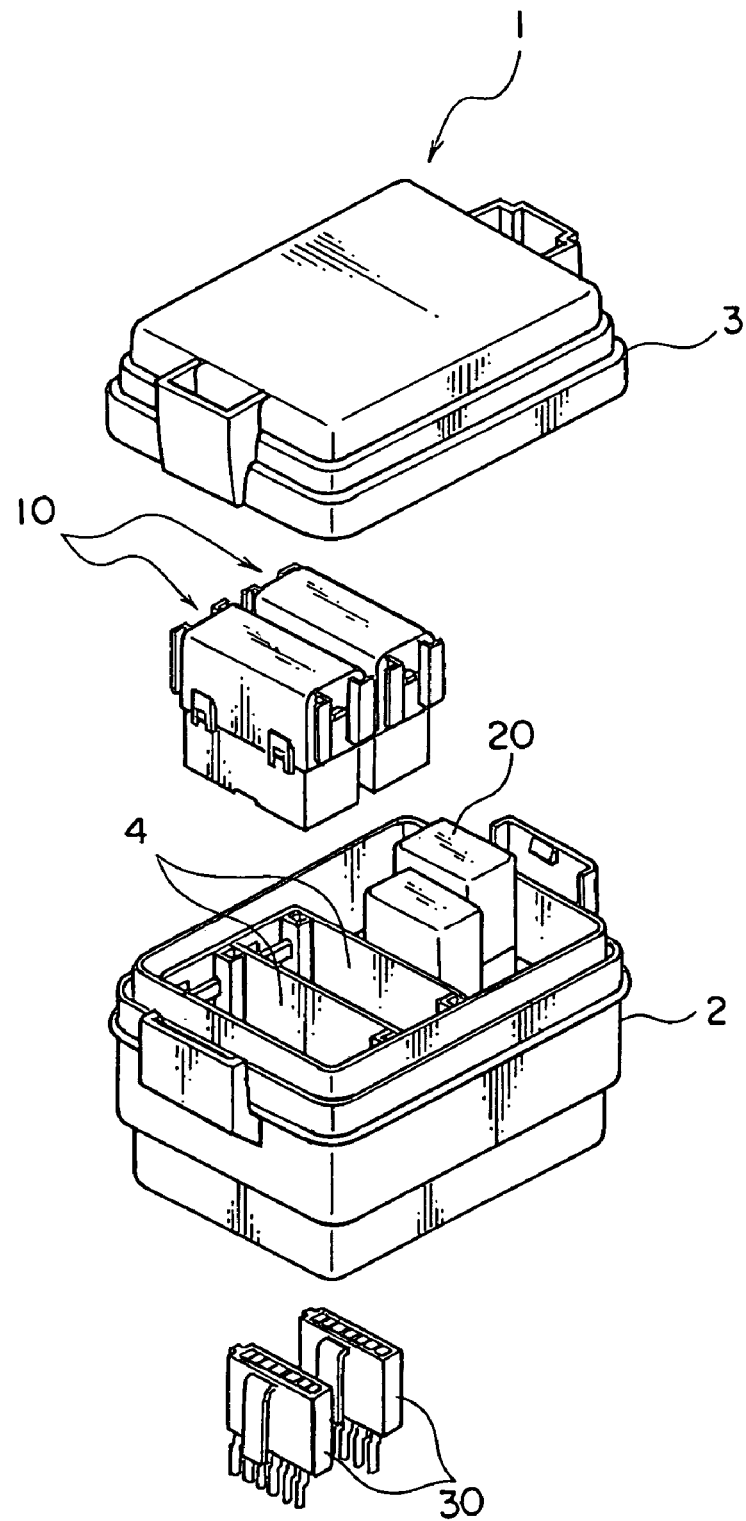
FIG. 1 is an exploded perspective view showing an electric coupling box receiving relay blocks.

As shown in FIG. 1, the electric coupling box 1 includes a box main body 2 having a substantially rectangular tray shape, a cover 3 covering an upper opening of the box main body 2, and a plurality of relay blocks 10 as the electrical component units. The box main body 2 includes a plurality of installation parts 4 for electric parts such as relay blocks 10 and relays 20 at an upper side thereof. The box main body 2 includes another installation parts (not shown) for connectors 30 connected to wires from loads at a lower side thereof, where the connectors 30 are electrically connected to the electric parts installed on the installation parts 4. The box main body 2 and the installation parts are integrally molded with insulating synthetic resin. A through hole for a lead wire is formed on the installation parts 4 for allowing the lead part of the electric part to project from a specific position.

Figure 2:
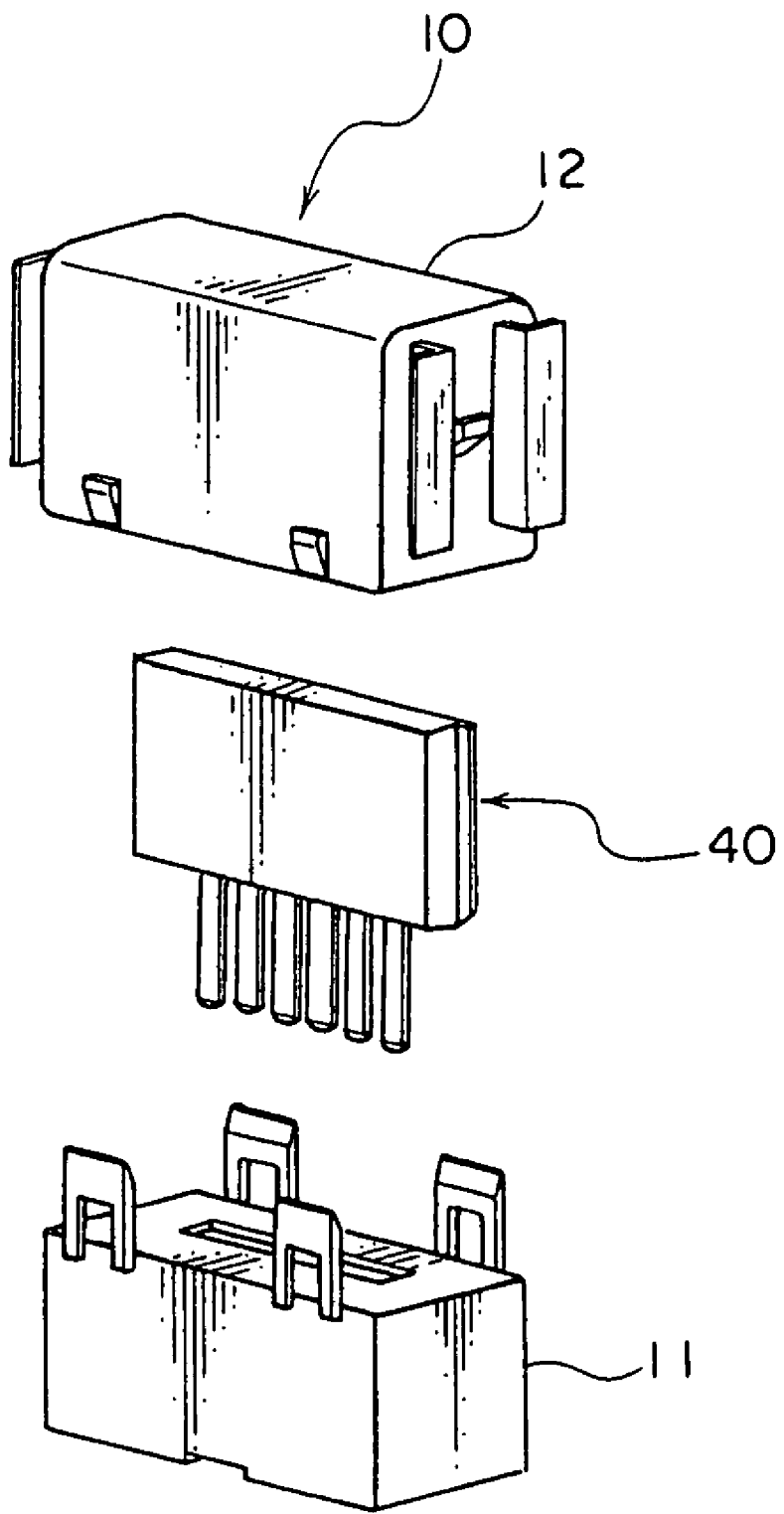
FIG. 2 is an exploded perspective view of the relay block in FIG. 1.

As shown in FIG. 2, the relay block 10 includes a case main body 11 having a substantially rectangular tray shape, a cover 12 covering the case main body 11, and a relay module 40. The case main body 11 and the cover 12 are made of insulating synthetic resin. The case main body 11 includes an installation part (not shown) for installing the relay module 40 of the present invention. A through hole is formed on the installation part for allowing the lead part of the relay module 40 to project from a specific position of the installation part.

Incidentally, in this first embodiment, the one relay block 10 receives the one relay module 40. However, the relay block may receive a plurality of relay modules 40. In this case, a plurality of installation parts is formed on the relay block 10, and a size of the relay block 10 is changed.

Figure 3:
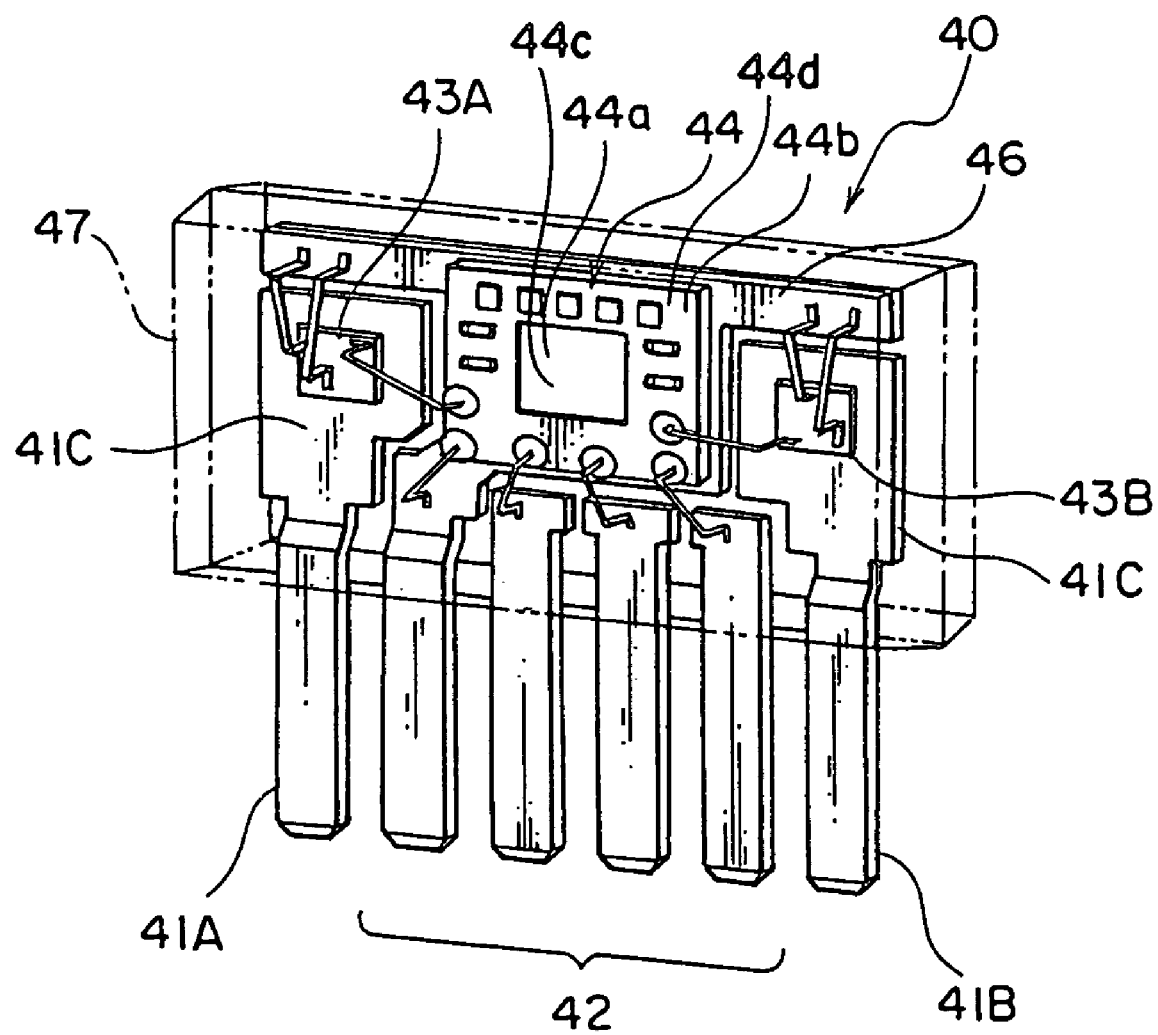
FIG. 3 is a perspective view showing an outline structure of a relay module according to the present invention.
Figure 4:
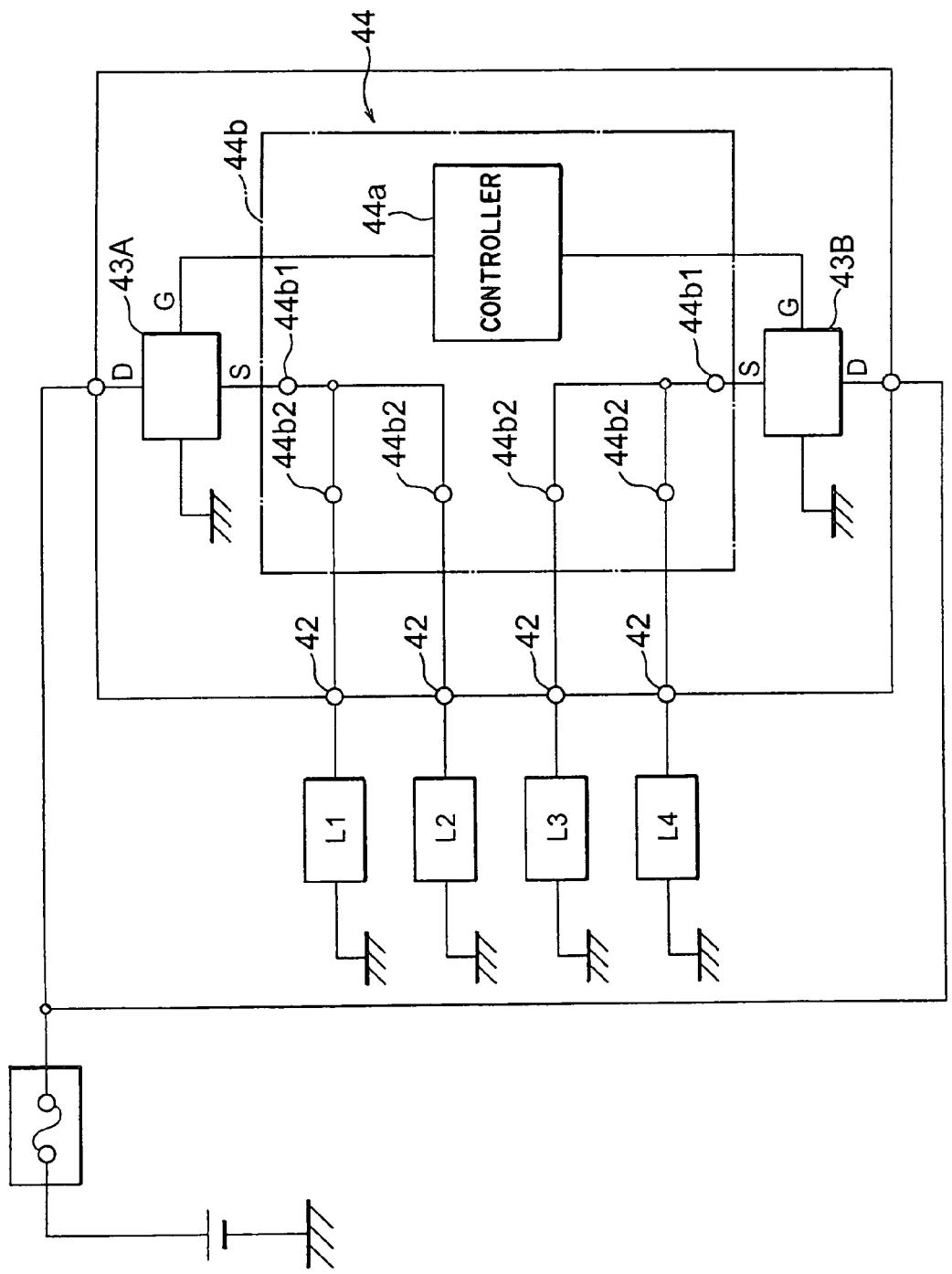
FIG. 4 is an equivalent circuit diagram of the relay module in FIG. 3.

As shown in FIGS. 3 and 4, the relay module 40 includes power lead parts 41A, 41B for connected to a power source, a plurality of connector lead parts 42 for connected to loads L1, L2, L3, L4, a semiconductor relay switches 43A, 43B interposed between and electrically connected to the power lead parts 41A, 41b and the connector lead parts 42, a control unit 44 for controlling the semiconductor switches 43A, 43B, and a molding part 47 at least sealing ends near the control unit 44 of the power lead parts 41A, 41B, and connector lead parts 42, the semiconductor relay switches 43A, 43B, and the control unit 44.

Each of the power lead parts 41A, 41B is installed on the relay block 10. Then, the relay block 10 is installed on the electric coupling box 1 and the power lead parts 41A, 41B are inserted into holes of a connector 30 and connected to terminals of the connector 30 so that the power lead parts 41A, 41B are connected to the power source through wires connected to the terminals.

Each of the connector lead parts 42 is installed on the relay block 10. Then, the relay block 10 is installed on the electric coupling box 1 and the connector lead parts 42 are inserted into the insertion holes of the connector 30 to be connected to the terminals of the connector 30. Thus, the connector lead parts 42 are electrically connected to the loads L1, L2, L3, L4 which for example drives a headlamp, or a motor for driving a wiper through wires connected to the terminals.

The power lead parts 41A, 41B and the connector lead parts 42 are made of metal plate such as aluminum, copper, copper-iron alloy, copper-iron-phosphorus alloy, copper-chromium alloy, copper-nickel-silicon alloy, copper-tin alloy, nickel-iron alloy, iron-nickel-cobalt alloy, copper-stainless steel alloy. Further, nickel-plated, silver-plated, or gold-plated metal plate is acceptable.

Further, because high current flows through the power lead parts 41A, 41B and the connector lead parts 42, the widths thereof are wide. Electric power is supplied to the connector lead parts 42 from the power lead parts 41A, 41B corresponding to switching operation of the semiconductor relay switches 43A, 43B.

An intelligent power switch, MOSFET (metal oxide silicon field effect transistor), or the like is used for the semiconductor relay switches 43A, 43B and installed on surfaces of the power lead parts 41A, 41B. Because drain electrodes as backside electrodes are electrically connected to die pads 41C of the power lead parts 41A, 41B, current capacities are relatively greater than those of surface electrodes of the semiconductor relay switches 43A, 43B and the high current can flow through the power lead parts 41A, 41B.

Incidentally, in the first embodiment, the semiconductor relay is used as a relay switch. However, the present invention is not limited to this. Various relays such as a mechanical relay or a hybrid relay can be used.

The control unit 44 includes a control member 44a having an MPU (microprocessor unit), an LSI (large-scale integrated circuits) and the like, and a control board 44b having the control member 44a and electric parts.

The control member 44a is electrically connected to gate electrodes of the semiconductor relay switches 43A, 43B, and controls the switching operations of the semiconductor relay switches 43A, 43B by outputting high/low signals as control signals to the gate electrodes.

The control board 44b includes a surface electrode 44c and a surface electrode at the connector side 44d. The surface electrode 44c and source electrodes of the semiconductor relay switches 43A, 43B are wire-bonded and electrically connected to each other. Similarly, the surface electrode at the connector side 44d and the connector lead parts 42 are wire-bonded and electrically connected to each other. The surface electrode 44c at the power lead part 41A side is electrically connected to the surface electrode at the connector side 44d by wiring patterns branching to the loads L1, L2 to which the semiconductor relay switch 43A supplies the power. Also, the surface electrode 44c at the power lead part 41B side is electrically connected to the surface electrode at the connector side 44d by wiring patterns branching to the loads L3, L4 to which the semiconductor relay switch 43B supplies the power.

According to such a configuration of the control board 44b, a power supplying line is formed for supplying the loads L1, L2, L3, L4 respectively through the connector lead parts 42 from the semiconductor relay switches 43A, 43B corresponding to the switching operations of the semiconductor relay switches 43A, 43B controlled by the control member 44a.

Incidentally, aluminum wire, gold wire, copper wire, or a ribbon of those can be used as a bonding wire connecting the power lead parts 41A, 41B and the control unit 44, the control unit 44 and the connector lead parts 42.

According to the first embodiment, a control unit having the control board 44b on which the control member 44a is installed is mounted on a plate-shaped frame member 46. However, if the control member 44a can be directly wire-bonded to the power lead parts 41A, 41B, the connector lead parts 42, and the semiconductor relay switches 43A, 43B, the control board 44b is not required.

In the molding part 47, ends of the power lead parts 41A, 41B and the connector lead parts 42 near the control unit 44, the semiconductor relay switches 43A, 43B, and the control unit 44 are plastic-molded in a substantially box shape. Namely, the power lead parts 41A, 41B and the connector lead parts 42 are extended from one sidewall of the molding part 47.

Thus, an outside shape of the relay module 40 is composed of an outside shape of the molding part 47, the power lead parts 41A, 41B and the connector lead parts 42 extended from the molding part 47, and the control unit 44 is molded in the molding part 47. Therefore, it is not necessary that the relay module 40 is installed on a substrate and received in a case member. Therefore, the relay module 40 can be downsized and save weight.

Next, a forming of the relay module 40 will be explained. First, power lead parts 41A, 41B, four connector lead parts 42, a lead member 46 used for the relay module 40 are formed in a lead frame in a specific shape by stamping, etching or the like. Then, the semiconductor relay switches 43A, 43B are respectively installed on the die pads of the lead frame. The control unit 44 is installed on the lead member 46. The semiconductor relay switches 43A, 43B and the control unit 44, the semiconductor relay switches 43A, 43B, and the lead member 46 are respectively wire-bonded. After the molding part 47 is formed on the lead frame by such as a transfer mold, extra parts of the lead breaks are cut. Thus, the relay module 40 is formed.

Next, an installation example of the relay module 40 and the relay blocks 10 to the electric coupling box will be explained with reference to FIGS. 1 and 2.

As shown in FIG. 2, the relay module 40 is installed on the installation part of the case main body 11, and the cover 12 covers the case main body 11, so that the relay module 40 is received and fixed to an interior of the relay block 10. Thus, the relay module installation process is simple and time for the installation can be reduced.

As shown in FIG. 1, two relay blocks 10 are installed on the installation parts 4 of the box main body 2, and the cover 3 covers the box main body 2, so that the two relay blocks 10 are received and fixed to an interior of the electric coupling box 1. The connectors 30 connected to the wires from the loads are installed on the connection installation parts from a lower side of the electric coupling box 1. Thus, the connectors 30 and the relay modules 40 are electrically connected to each other, and the connector lead parts 42 and the loads L1, L2, L3, L4 are electrically connected to each other through the wires connected to the connectors 30.

When supplying the power to the loads L1, L2, the control member 44a of the control unit 44 switches on the semiconductor relay switch 43A and the power is supplied to the loads L1, L2 through the semiconductor relay switch 43A from the power lead part 41A. Similarly, when supplying the power to the loads L3, L4, the control member 44a of the control unit 44 switches on the semiconductor relay switch 43B and the power is supplied to the loads L3, L4 through the semiconductor relay switch 43B from the power lead part 41B.

According to the relay module 40 of the first embodiment, the molding part 47 seals the ends of the power lead parts 41A, 41B, connector lead parts 42 near the control member 44a, the semiconductor relay switches 43A, 43B, and the control member 44a. Therefore, no useless space such as a control board is generated. Therefore, the relay module 40 can be downsized, and save weight. Further, because a member for connecting the conventional relay module and the control board is not required, cost of the relay module 40 can be reduced.

Further, according to the electronic component unit of the first embodiment, because using the downsized, light-weighted relay module 40, the relay block 10 can be downsized, and save weight. Further, because the relay module 40 is downsized and light-weighted, a larger number of relay modules 40 can be installed. Therefore, it makes easier to exchange the relay modules 40 when a design changes. Thus, maintenanceability of the relay module 40 can be improved.

Incidentally, if a plurality of or some kinds of control units 44 are plastic molded on the relay module 40, only the relay module 40, which is required to change owing to the design change, can be changed. Therefore, the maintenanceability of the relay module 40 is further improved.

Further, according to the first embodiment, the power lead parts 41A, 41B and the connector lead parts 42 are extended from one side of the molding part 47. However, various forms can be used. For example, the power lead parts 41A, 41B and the connector lead parts 42 are fully molded so as to be electrically connected.

Further, according to the relay module 40 described above, the power is supplied to the loads through the two of connector lead parts 42 of each of the power lead parts 41A, 41B. However, the present invention is not limited to this. Various forms can be used. For example, the power lead parts 41A, 41B and the connector lead parts 42 are respectively connected in one to one relationships. For another example, two of the connector lead parts 42 are respectively connected to a power line and a control line.

Further, in the first embodiment, the semiconductor relay switches 43A, 43B correspond to the two of power lead parts 41A, 41B. However, the number of those can be optionally set.

Second Embodiment

One embodiment of the box main body 2 including a relay block having the relay module 40 of the first embodiment and the conventional relay block will be explained.

Figure 5:
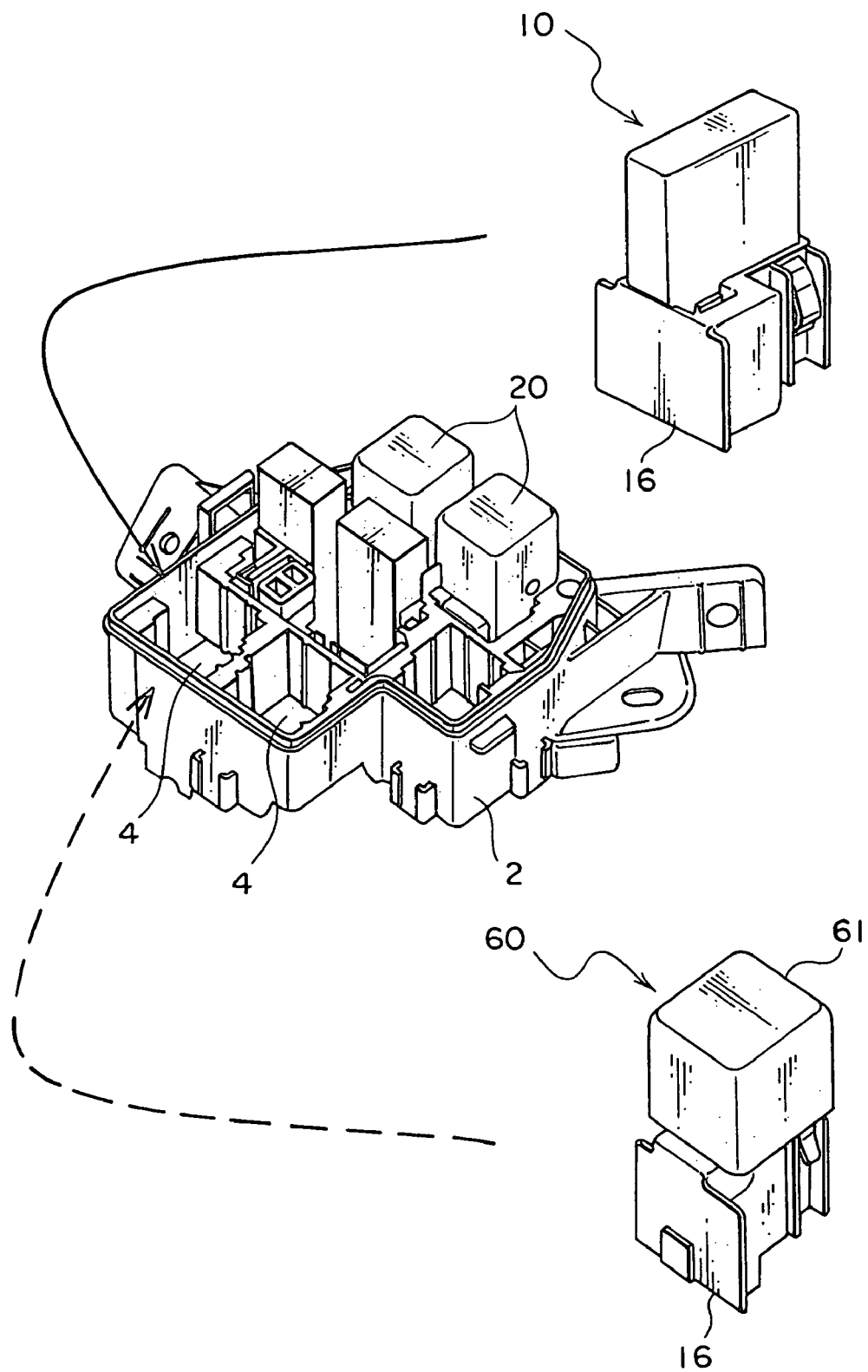
FIG. 5 is an explanatory view showing how the relay block is received in the electric coupling box.

In FIG. 5, the electric coupling box 1 includes the box main body 2, the cover 3 (see FIG. 1), and the relay block installed corresponding to a product or the conventional relay block 60.

The box main body 2 includes a plurality of installation parts 4 for electric parts such as relay blocks 10 and relays 20 at an upper side thereof. The box main body 2 includes another installation parts (not shown) for connectors 30 connected to wires from loads at a lower side thereof, where the connectors 30 are electrically connected to the electric parts installed on the installation parts 4. A through hole for a lead wire is formed on the installation parts 4 for allowing the lead part of the electric part to project from a specific position.

As shown in FIG. 6A to 6C, the relay block 10 includes a block member 16 formed corresponding to the shape of the installation parts 4 for connecting to the installation parts 4 of the box main body 2, a cover case 17 to be installed on the block member for receiving the relay module 40, and the relay module 40.

The block member 16 and the cover case 17 are made of insulating synthetic resin. The block member 16 includes a plurality of insertion holes 16a to which power lead parts 41A, 41B and the connector lead parts 42 are inserted, a fitting member 16b into which the cover case 17 is fitted, and an engaging member 16c for engaging with an engaging member (not shown) mounted on an inner wall of the installation part 4.

The cover case 17 includes a press-fitting part 17a into which the relay module 40 is press-fitted, an extending part 17b for covering leads of the relay module 40 fitted into the press-fitting part 17a, and fitted into the fitting member 16b, and an identification part 17c identifying the relay module 40 to be press-fitted into the press-fitting part 17a.

The press-fitting part 17a is formed in a shape to allow the relay module 40 to be press-fitted into the cover case 17 having a substantially box shape. For preventing the relay module 40 from falling out, a projection, a catch, or the like is formed in an interior of the press-fitting part 17a.

The extending part 17b is extended from the press-fitting part 17a to cover the leads of the relay module 40 fitted into the press-fitting part 17a. An interior of the extending part 17b is formed in a shape to allow the relay module 40 to pass through. Thus, the extending part 17b protects the leads of the relay module 40, so that a trouble that the leads are bent at assembling is prevented. Accordingly, handling ability at the assembling of the relay module 40 with the cover case 17 is improved.

The identification part 17c has a color corresponding to a duty ratio of the relay module 40 or a product number of the relay module 40. Regarding the color, various forms can be accepted. For example, the color is the same as a color of a material of the cover case 17. Alternatively, the color is the color painted on a whole or a part of surface of the cover case 17. Alternatively, the color is a color of a label or the like stuck on the cover case 17. Thus, the identification part 17c prevents workers from miss-assembling the relay module 40.

Next, an assembling example of the relay blocks 10 of the second embodiment will be explained with reference to FIG. 6.

As shown in FIG. 6A, the relay module 40 is pressed into the press-fitting part 17a of the cover case 17 having the identification part 17c corresponding to the relay module 40. Then, as shown in FIG. 6B, the extending part 17b is fitted into the fitting member 16b, and the leads of the relay module 40 are inserted into the insertion holes 16a. Thus, as shown in FIG. 6C, the relay blocks 10 is assembled. Then, the relay module 40 is fitted into and installed on the installation parts 4 of the box main body 2.

The conventional relay block 60 includes a case main body 61 and the block member 16. The case main body 61 includes a control board having a connector and a semiconductor relay. Similar to the relay block 10, the case main body 61 is installed on the block member 16, and the conventional relay block 60 is assembled. Then, the conventional relay block 60 is fitted into and installed on the installation parts 4 of the box main body 2.

According to the relay blocks 10 of the second embodiment, because the downsized, light-weighted relay module 40 is used, the relay block 10 can be downsized and save weight. Further, because the relay module 40 is downsized and light-weighted, a larger number of relay modules 40 can be installed. Therefore, it makes easier to exchange the relay modules 40 when a design changes. Thus, maintenanceability of the relay module 40 can be improved.

Further, the block member 16 is used for the relay block 10 and the conventional relay block 60. Therefore, the box main body 2 and a production line work for common use. Therefore, cost of the product can be reduced.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A relay module comprising:
   a power lead part connected to a power source;
   a connector lead part connected to a load, and made of flat lead frames;
   a relay switch interposed between the power lead part and the connector lead part, and electrically connected thereto, and mounted within the confines of the power lead part;
   a control member for controlling the relay switch; and
   a molded part, having side walls, sealing by having embedded in the molded part, at least ends of the power lead part and the connector lead part, the relay switch, and the control member, the ends being adjacent the relay switch and the control member with no electrical components disposed therebetween, with the power lead and the connector lead extended from one same side wall of the molded part and the control unit molded and sealed therein,
   wherein the control member and relay switch are respectively mounted on the flat lead frames.

2. An electrical component unit comprising:
   a relay module as claimed in claim 1;
   a connector connected to a wire from a load; and
   a receiving chamber for receiving the relay module and the connector, said relay module and the connector are electrically connected.

* * * * *